(12) United States Patent
Lee et al.

(10) Patent No.: US 6,221,154 B1
(45) Date of Patent: Apr. 24, 2001

(54) METHOD FOR GROWING BETA-SILICON CARBIDE NANORODS, AND PREPARATION OF PATTERNED FIELD-EMITTERS BY CHEMICAL VAPOR DEPOSITON (CVD)

(75) Inventors: Shuit-tong Lee, Kowloon; Chun-Sing Lee, Quarry Bay; Ning Wang, Kowloon; Igor Bello, Kowloon; Carol Hau Ling Lai, Kowloon, all of (HK); Xing Tai Zhou, Shenyang (CN); Frederick Chi Kan Au, Happy Valley (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 09/252,568

(22) Filed: Feb. 18, 1999

(51) Int. Cl.$^7$ .................................................. C30B 29/62
(52) U.S. Cl. ............................ 117/87; 423/345; 427/589
(58) Field of Search ................... 75/952; 148/DIG. 148; 117/75, 87, 921, 951; 252/183.14; 264/682; 423/345; 427/589, 903, 18; 428/34.5, 367, 401; 501/88, 95.3; 216/7, 11

(56) References Cited

U.S. PATENT DOCUMENTS

| | | | | |
|---|---|---|---|---|
| 3,632,405 | * | 1/1972 | Knippenberg et al. | 117/106 |
| 4,873,070 | * | 10/1989 | Kaji et al. | 423/345 |
| 4,911,781 | * | 3/1990 | Fox et al. | 156/607 |
| 5,525,556 | * | 6/1996 | Dunmead et al. | 501/92 |
| 5,997,832 | * | 12/1999 | Lieber et al. | 423/249 |
| 6,031,250 | * | 2/2000 | Brandes et al. | 257/77 |
| 6,113,722 | * | 9/2000 | Hoffman et al. | 156/155 |

OTHER PUBLICATIONS

Honglie Dai, et al.; "Synthesis and characterization of carbide nanorods"; *Nature;* Jun. 1995; vol. 375, pp. 769–772.
Sumio Iijima; "Helical microtubules of graphitic carbon"; *Nature;* Nov. 7, 1991; vol. 354, pp. 56–58.
Y.F. Zhang, et al.; "Silicon nanowires prepared by laser ablation at high temperature"; *Applied Physics Letters;* Apr. 13, 1998; vol. 72, No. 15, pp. 1835–1837.
William E. Hollar, Jr., et al.; "Review of VLS SiC Whisker Growth Technology"; *Ceram. Eng. Sci. Proc.;* 1991; pp. 979–991.
Arrigo Addamiano; "Preparation and Properties of 2H SiC Crystals"; *Journal of Crystal Growth;* 1982; pp. 617–622.
Janeuay; "Art: Reinforcing Tomorrow's Technology"; *Ceramic Industry;* Apr. 1991; pp. 42–44.
G.W. Meng, et al.; "Synthesis of " A β–SiC Nanorod within a SiO2 Nanorod "One Dimensional Composite Nanostructures"; *Solid State Communications;* 1998; vol. 106, No. 4, pp. 215–219.
Walt A. de Heer, et al.; "A Carbon Nanotube Field–Emission Electron Source"; *Science;* Nov. 17, 1995; vol. 270, pp. 1179–1180.

* cited by examiner

Primary Examiner—Randy Gulakowski
Assistant Examiner—Allan Olsen
(74) Attorney, Agent, or Firm—Merchant & Gould P.C.

(57) ABSTRACT

A method and an apparatus have been developed to grow beta-silicon carbide nanorods, and prepare patterned field-emitters using different kinds of chemical vapor deposition methods. The apparatus includes graphite powder as the carbon source, and silicon powder as silicon sources. Metal powders (Fe, Cr and/or Ni) are used as catalyst. Hydrogen was the only feeding gas to the system.

15 Claims, 21 Drawing Sheets

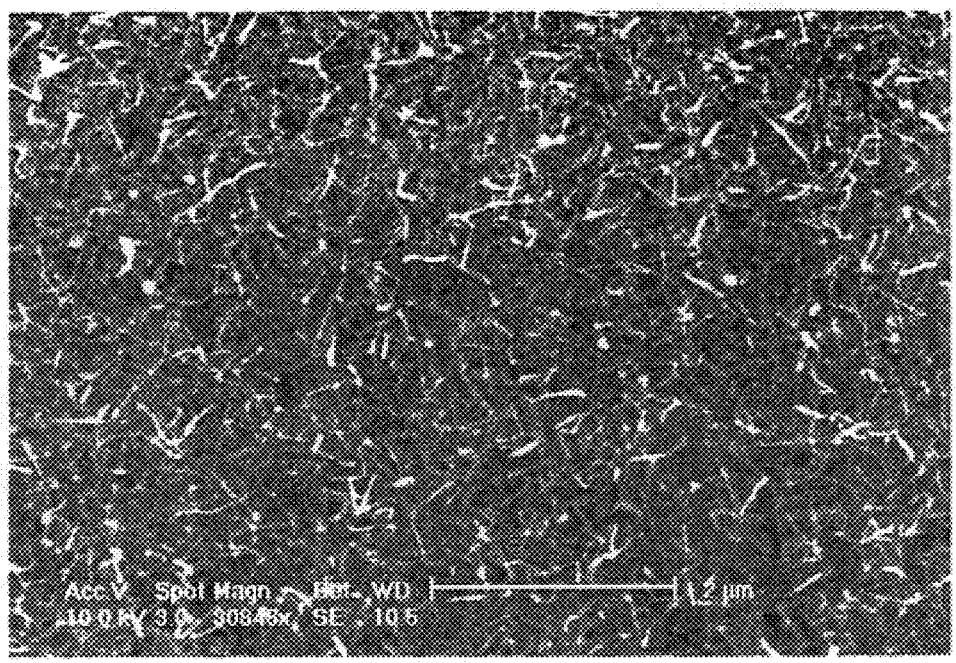
(a)
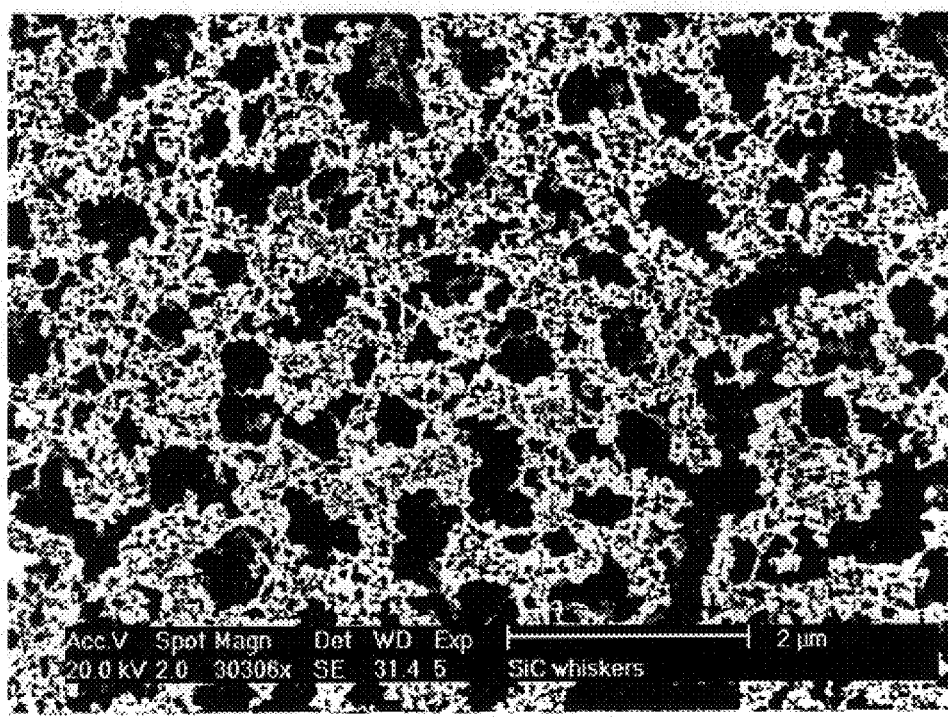
(b)
Fig. 2

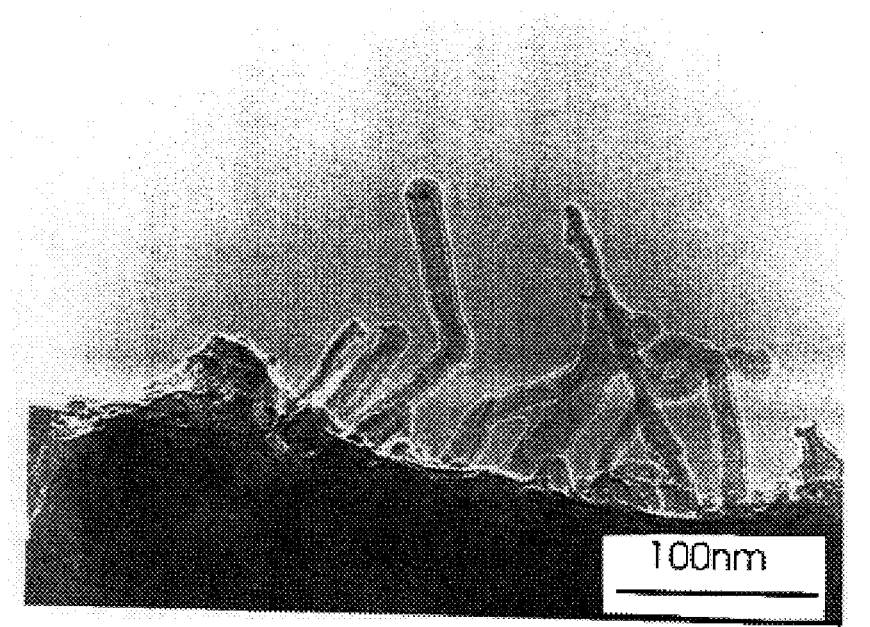
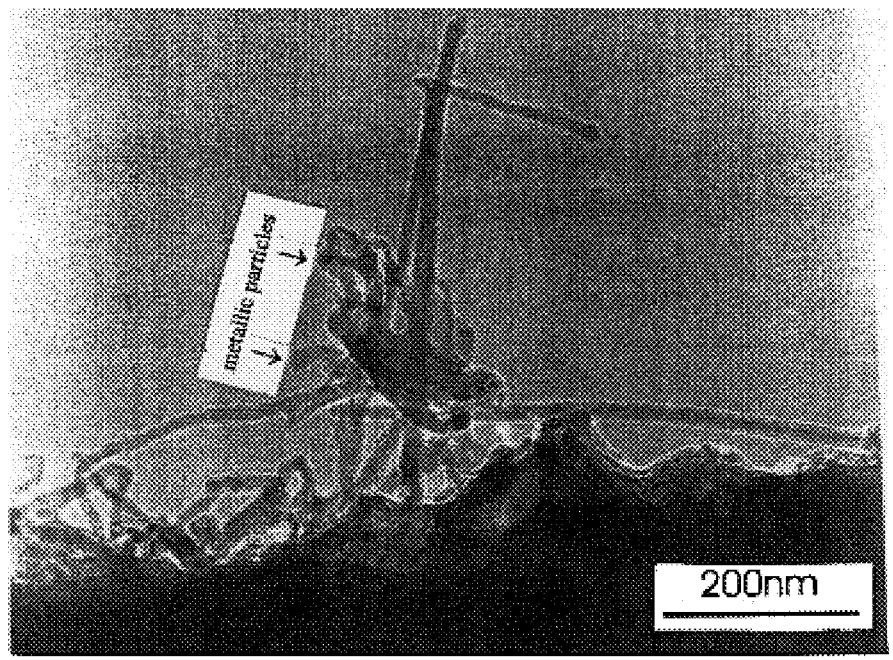
Fig. 4

METHOD FOR GROWING BETA-SILICON CARBIDE NANORODS, AND PREPARATION OF PATTERNED FIELD-EMITTERS BY CHEMICAL VAPOR DEPOSITON (CVD)

FIELD OF INVENTION

The present invention relates to a method and an apparatus for the growth of beta-silicon carbide nanorods, and to the preparation of patterned field-emitters by chemical vapor deposition (CVD).

BACKGROUND OF THE INVENTION

After the discovery of carbon nanotubes by Iijima (Nature, 354, p.56, 1991), nanotubes and nanowires/nanorods of various materials, including Si, SiC, Ge, etc, have been synthesized (Zhang et al., Applied Physics Letter, 72, p.1835, 1998; Dai et al., Nature, 375, p. 769, 1995).

For potential mechanical applications, silicon carbide nanorods have attracted great interest because micrometer-sized SiC whiskers are widely used to strengthen composite materials. Recent work reported that the elasticity and strength of SiC nanostructures are considerably greater than those of larger SiC structures. The physical and electrical properties of silicon carbide also make it an interesting semiconductor for high temperature, high power and high speed device applications.

Various growth techniques have been used to synthesize SiC whiskers with diameters in micrometer or sub-micrometer scale, for example, carbothermal reduction of silica (Hollar and Kim, Ceramic Engineering Science Proceeding, 12, p. 979, 1991), decomposition of organic silicon compounds (Addamiano, Journal of Crystal Growth, 58, p.617, 1982) and reduction between silicon halides and tetrachloromethane (Janeuay, Ceramic Industry, 4, p.42, 1992), etc. Dai et al. (Nature (London), 375, p.769, 1995) have reported the synthesis of SiC nanorods by a two-step method, called carbon nanotube template-mediated growth. However, this process requires the preparation of carbon nanotubes before obtaining SiC nanorods, which implies additional production steps and increased cost. Recently, beta-SiC nanorods with diameters of about 30 nm have been prepared by carbothermal reduction of sol-gel derived silica xerogels containing carbon nano-particles (Meng et al., Solid State Communications, 106, p.215, 1998). However, as the nanorods have to be grown on the surface of xerogels, this method can hardly be applied for electronic device fabrication.

Carbon nanotubes are one of the popular materials used in field-emitters (W. A. de Heer et al., Science, 270, p. 1179, 1995), but silicon carbide nanorods have never been used in this field.

For the purpose of the present specification the term "nanorod" should be understood to define a filament having a diameter of the order of 10 to 100 nm.

SUMMARY OF INVENTION

The present invention provides a method for synthesizing β-SiC nanorods, and the preparation of patterned field-emitters by a simple one-step synthesizing method.

It is an object of the invention to provide a method and an apparatus for the growth of beta-silicon carbide nanorods, and preparation of patterned field-emitters that may be performed in a CVD chamber.

According to the present invention therefore there is provided a method for the growth of beta-silicon carbide nanorods on a substrate by chemical vapor deposition, wherein solid carbon and solid silicon are used as the carbon and silicon sources, hydrogen is used as a reactant gas, and wherein a metal powder is used as a catalyst.

The source of silicon and carbon used in the method is preferably a plate or target formed from silicon powder, graphite and a metal powder as catalyst. The catalyst may be any of iron, chromium or nickel or a combination thereof.

Preferably the substrate may be a silicon wafer.

The nanorods may be grown by any form of CVD technique, but a preferred method is to use a hot filament excitation technique. The filament temperature may be maintained in the range of from about 1800° C. to 2300° C. The substrate is preferably maintained at a temperature of from about 600° C. to 1300° C.

The distance between the filament and the source may be varied to optimise growth. Preferably the distance is between 1 to 4 mm. Similarly the distance between the filament and the substrate may be varied to optimise growth. Preferably the distance between the substrate and the filament is maintained between about 1 to 7 mm.

The deposition time may also be varied to optimise growth. Typical deposition times vary from 3 to 180 minutes.

The substrate may also preferably be electrically biased, by at least 200 V. The electrical bias may be either purely DC, pulsed DC, AC, or radiofrequency.

The nanorods may preferably be deposited on the substrate to form a pattern. For example in one method of achieving a patterned deposition the substrate is a silicon wafer coated with a silicon dioxide layer and the substrate is photoengraved with a desired pattern prior to deposition of the nanorods, and wherein after deposition of the nanorods the silicon dioxide layer is removed by chemical etching.

A patterned deposition is particularly useful in allowing the present invention to be used to form a patterned field emitter array wherein the individual β-silicon carbide nanorods form the field emitters of the array.

Viewed from another broad aspect the present invention provides apparatus for the chemical vapor deposition of beta-silicon carbide nanorods, comprising a chemical vapor deposition chamber, means for holding a substrate in the chamber, means for supporting one or more filaments in the chamber, and means for supporting a pressed solid plate in the chamber, the one or more filaments being supported between the substrate and the solid plate in use, means for adjusting the spacing between the substrate and the source, and means for heating the substrate, wherein the solid plate comprises a plate or target formed from compressed silicon powder, graphite powder and a metal powder catalyst.

Preferably the apparatus also includes means for electrically biasing the substrate holding means relative to the pressed solid plate.

Viewed from another broad aspect the present invention provides a method for the preparation of a patterned field-emitter material comprising (a) forming beta-silicon carbide nanorods on a substrate by chemcial vapor deposition, and (b) removing selected areas of said nanorods by chemical etching to a leave a desired pattern.

BRIEF DESCRIPTION OF THE DRAWINGS

Some embodiments of the invention will now be described by way of example and with reference to the accompanying drawings, in which:

FIG. 2 is a scanning electron microscope (SEM) micrograph of (a) the β-SiC nanorods and (b) the β-SiC whisker grown on Si(100) substrate, corresponding to example 1, FIG. 4 is a plane view transmission electron microscope (TEM) micrograph of the β-SiC nanorods shown in FIG. 2.

DETAILED DESCRIPTION OF THE PREFERRED EMBODIMENTS

Figure 1:
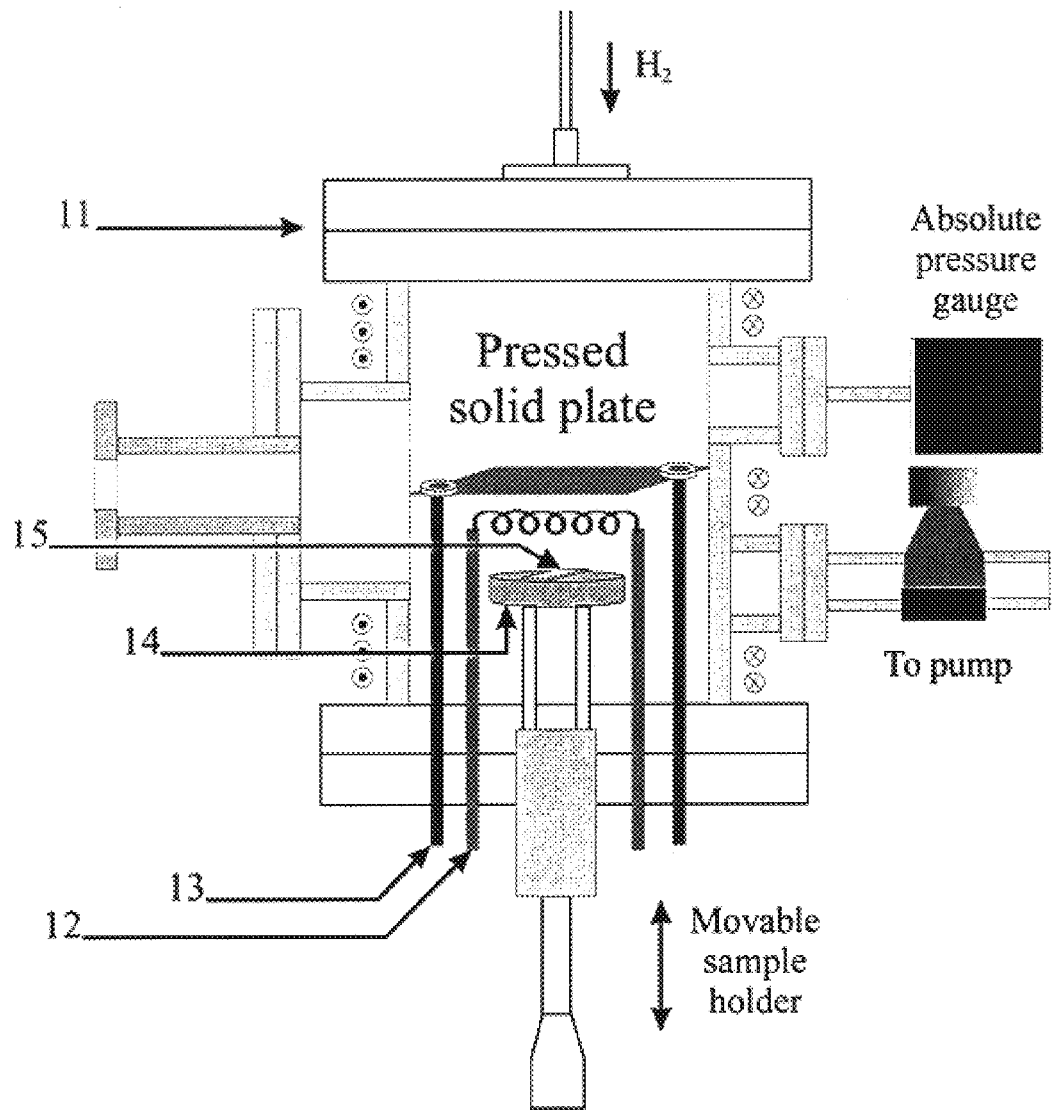
FIG. 1 is a schematic diagram of the apparatus according to an embodiment of the present invention.

Referring to FIG. 1, a chemical vapor deposition (CVD) reactor 10 is shown. Reactor 10 consists of a CVD chamber 11, two feedthroughs 13 for holding a pressed solid plate serving as a source material, two feedthroughs 12 for supporting a filament support, and a substrate holder 14 for substrate biasing. The substrate holder 14 is moveable so that the distance between the filament and the substrate 15 can be varied between 0 (in contact with the filament) and 30 mm. The substrate holder 15 is connected to a controlled DC power supply for electrically biasing the substrate holder relative to the filament. Alternatively, the substrate holder 15 can be isolated from ground so it is at a floating electrical potential, or it can be connected to ground.

The CVD reactor 10 further comprises an inlet 16 for a reactant gas which is circulated through the chamber 11 by means of a pump 17. A pressure gauge 18 is provided for monitoring the pressure of the reactant gas in the chamber 11.

A suitable substrate, which can be silicon, silicon dioxide or any other materials suitable for the deposition environment, is mounted on a substrate holder which is electrically biased. The substrate holder is preferably biased at a value higher than 200 volts negatively with respect to the filaments. The electrical bias may be either purely DC, pulsed DC, AC, or radiofrequency.

The growth of β-SiC nanorods is carried out at a pressure of 5 to 100 Torr and temperature of 600 to 1300° C. for 3 to 180 minutes. CVD using hot filament excitation techniques is one possible CVD technique that may be used with the present invention, but others are equally possible: for example using microwave, rf or dc plasma source, collisional process or laser ablation as are well known in the art.

A patterned field-emitter can be prepared by growing the nanorods onto patterned substrates. As an example, photoengraved silicon dioxide film is prepared by photoengraving parts of the silicon dioxide film to re-expose the silicon selectively. After deposition of nanorods on the patterned substrate, silicon dioxide is etched away by $HF_{(aq.)}$ to give patterned field-emitters.

The negative bias accelerates ions to the substrate in order to increase ion bombardment. The growth of beta-silicon carbide nanorods probably involves the following process: (1) Atomic hydrogen is produced from hydrogen decomposition activated by such mean as hot filaments, microwave source, rf or dc plasma source etc, and volume collisional processes. (2) The catalytic metals (Fe, Cr, and Ni) are evaporated and transported to the substrate and deposited as nano-particles during the heating by activation sources. (3a) Hydrocarbon radicals ($C_xH_y$.) and silane radicals ($SiH_x$.) are formed by the reaction of atomic hydrogen with the pressed solid plate consisting of graphite, silicon and metal powders. (3b) Atomic hydrogen reacts with the silicon parts of substrate to form silane radicals ($SiH_x$.). (4) The $C_xH_y$. radicals and $SiH_x$. radicals adsorb and diffuse onto the nano-metal particles. (5) Upon surface reactions of $C_xH_y$. and $SiH_x$. radicals, beta-silicon carbide nanorods are formed.

The following examples and comparative examples are presented for further elaboration of the invention.

Example 1

The β-SIC nanorods for this sample was prepared in the apparatus shown in FIG. 1. The substrate was a mirror-polished silicon (100) wafer and the pressed solid plate consisted of graphite, silicon and three catalytic metals (Fe, Cr and Ni) powders in a molar ratio of 10:10:0.025. The distance between the pressed solid plate and filaments was 3 mm and that between filaments and substrate was 2 mm. Hydrogen flow rate was 100 sccm and the chamber pressure was maintained at 10 Torr. The temperatures of the filaments and substrate were 2200° C. and 1000° C., respectively. The growth time was 120 minutes.

Figure 3:
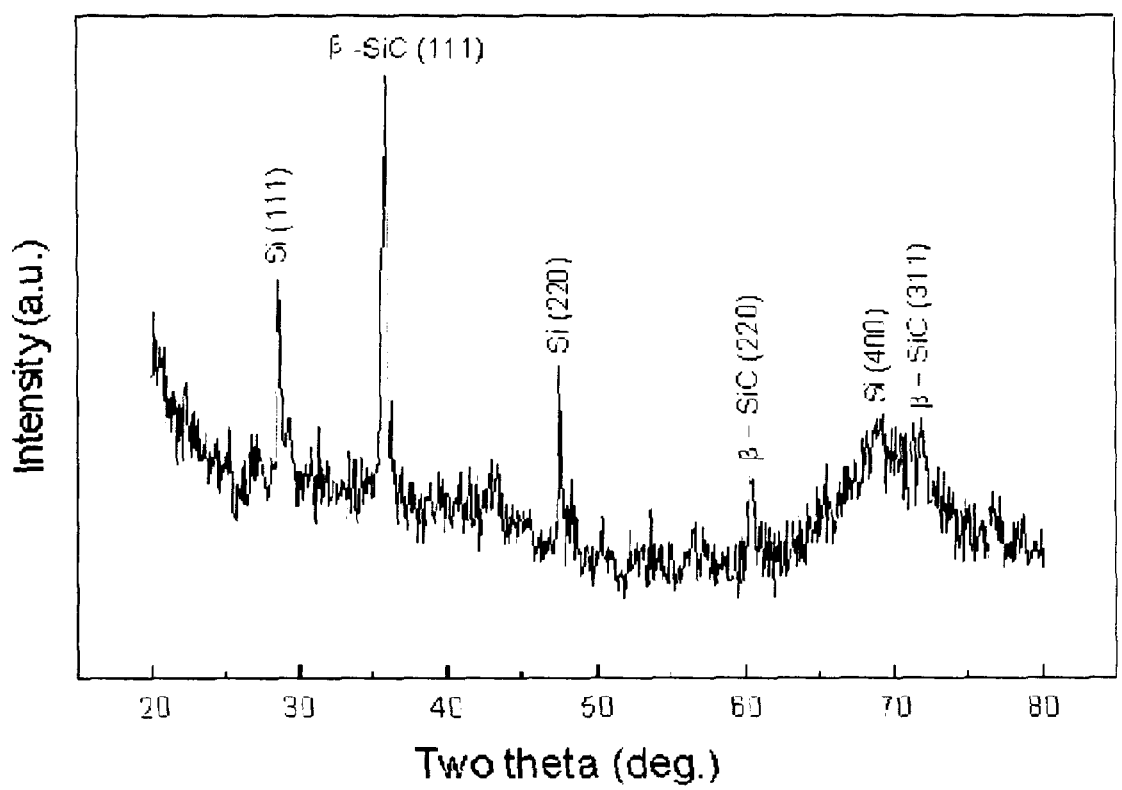
FIG. 3 is an x-ray diffraction (XRD) spectrum of the β-SiC nanorods shown in FIG. 2.
Figure 5:
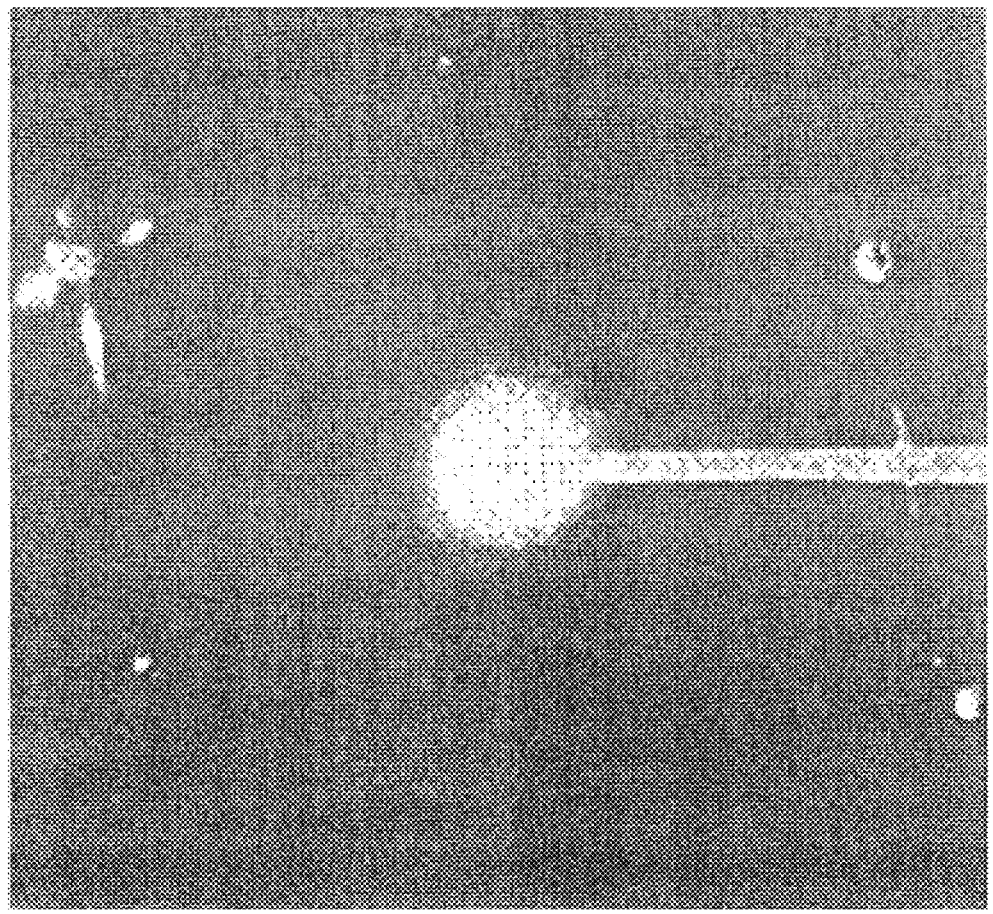
FIG. 5 is a selected area diffraction (SAD) pattern of the β-SiC nanorods shown in FIG. 4.

SEM micrographs of the above sample are shown in FIG. 2. Two different types of β-SiC nanorods were observed; the first type consists of individual straight or curved nanorods and the other type is of a web-like structure of nanorods. In order to determine the structure of the sample, x-ray diffraction (XRD) was employed. An XRD spectrum of the sample is shown in FIG. 3, where several peaks are visible, the β-SiC(111)peak has the highest intensity, while the weak β-SiC(220) and β-SiC(311) peaks are also distinctive. Peaks due to the silicon carbide as well as deposited silicon were also observed. A TEM micrograph of the nanorods is shown in FIG. 4. The nanorods are about 10–30 nm in diameter and several hundred nanometers in length. The corresponding selected area diffraction (SAD) pattern as shown in FIG. 5 further confirmed that the nanorods are β-SiC. According to the energy-dispersed x-ray (EDX) microanalysis, metallic particles (Fe, Cr, and Ni) were found at the tips of most nanorods.

Example 2

In this example, a processing apparatus similar to that shown in FIG. 1 was used to grow the β-SIC nanorods. The substrate was a silicon dioxide film on a silicon wafer of (100) orientation, and the pressed solid plate was composed of silicon, graphite and nickel powder in a molar ratio of 3:7:0.0075. The distance between the pressed solid plate and the filaments was 1 mm and that between the filaments and the substrate was 5 mm. The hydrogen flow rate was 100 sccm and the pressure was 50 Torr. The filament temperature was 2100° C. and the substrate temperature was 850° C. The growth time was 3 minutes.

Figure 6:
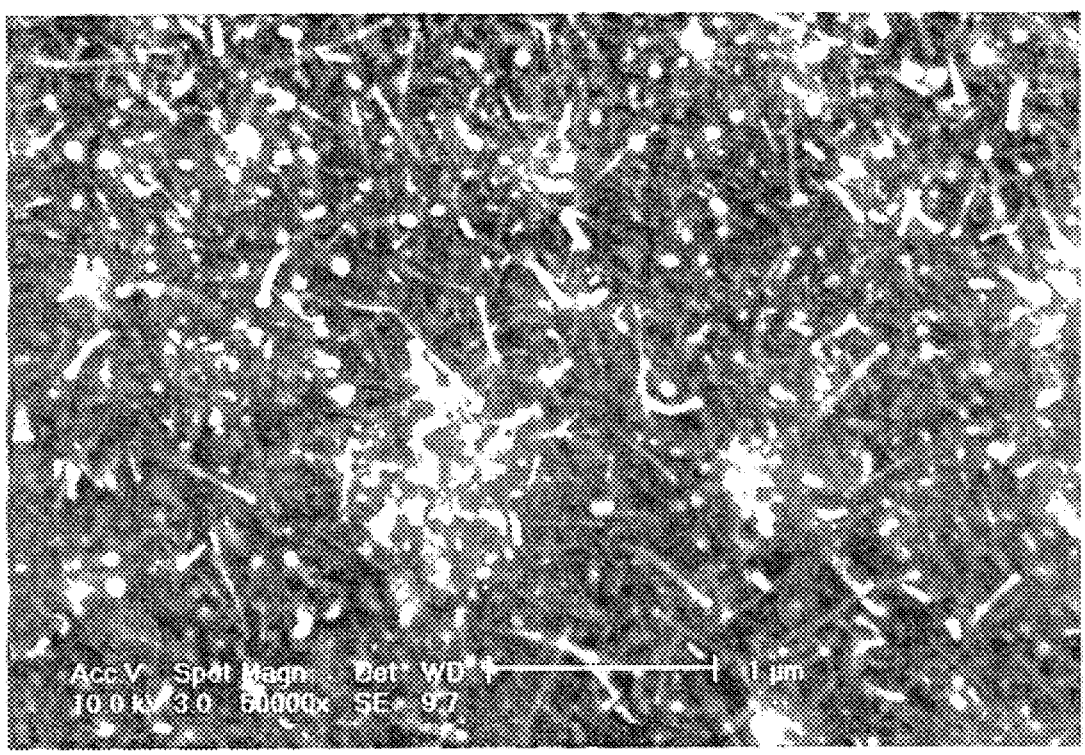
FIG. 6 is an SEM micrograph of the β-SiC nanorods grown on the $SiO_2$ film as described in example 2.
Figure 7:
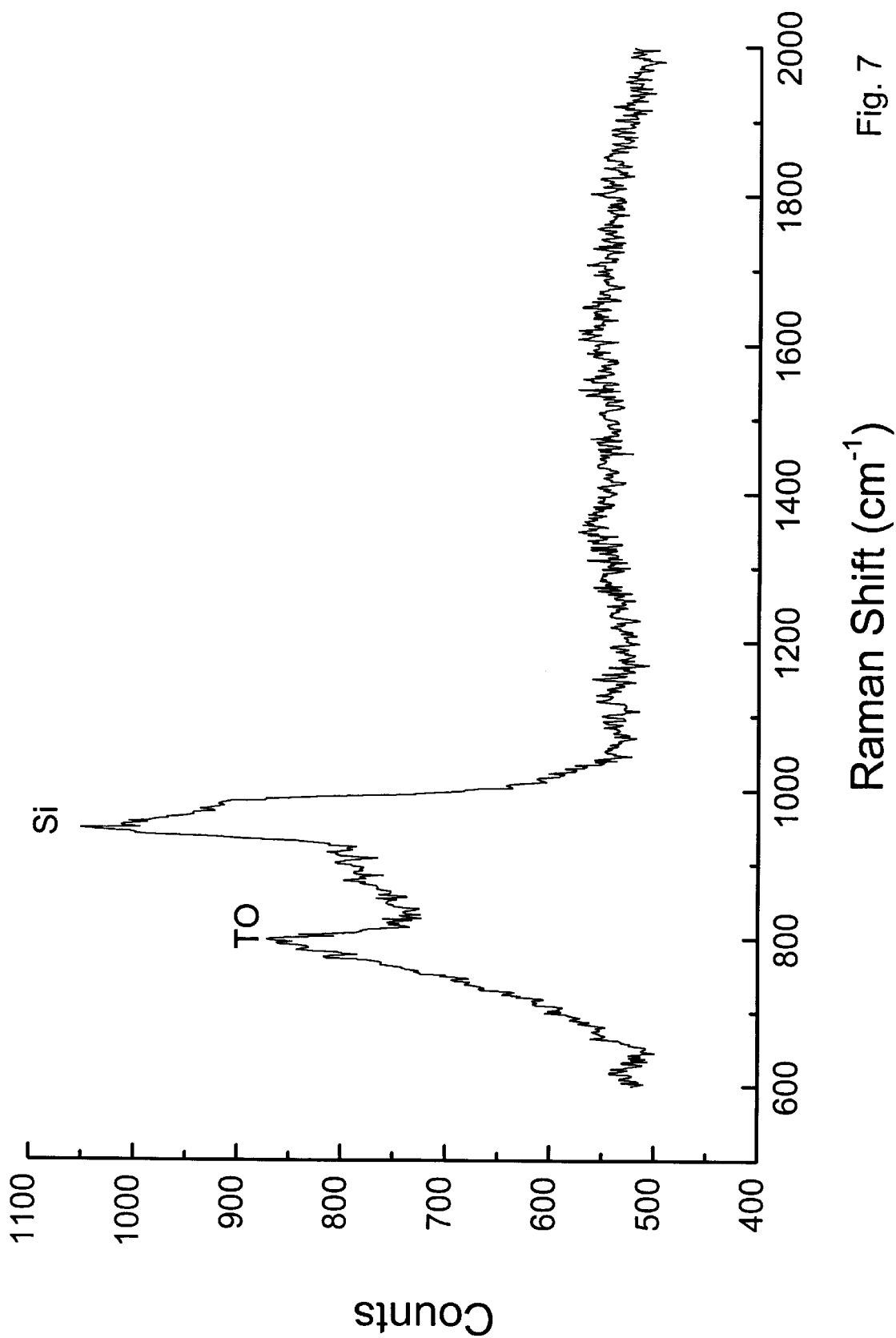
FIG. 7 is a Raman spectrum of the β-SiC nanorods shown in FIG. 6.
Figure 8:
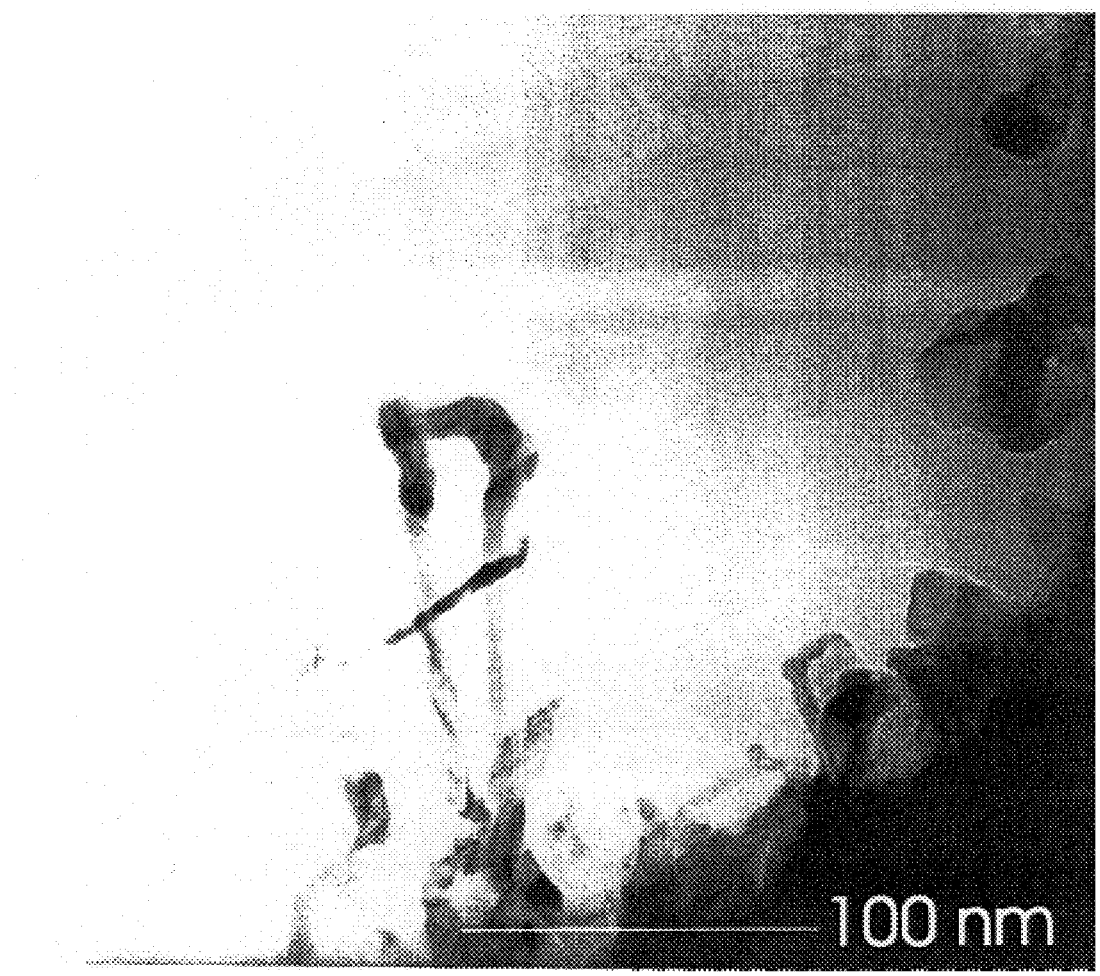
FIG. 8 is a plane view TEM micrograph of the β-SiC nanorods shown in FIG. 6.

An SEM micrograph of the as grown nanorods is shown in FIG. 6. A Raman spectrum of the sample is shown in FIG. 7. The peak at 796 $cm^{-1}$ corresponds to the transverse optic (TO) phonon peak of β-SiC and the peak at 964 $cm^{-1}$ corresponds to the second order peak of silicon. A TEM micrograph (FIG. 8) shows that the sample consists of nanorods of diameters about 10–30 nm. EDX microanalysis also showed that nickel is present at the tips of most nanorods.

Example 3

β-SiC nanorods in this example are prepared in the apparatus as shown in FIG. 1. The substrate was a mirror-polished silicon wafer of (100) orientation. The pressed solid plate consisted of silicon, graphite and chromium powders in the molar ratio of 2:8:0.005. The distance between the pressed plate and the filaments was 2 mm and that between the filaments and substrate was 2 mm. The hydrogen flow rate was 100 sccm. The pressure was 5 Torr. The bias voltage was 400 V with an emission current of 50 mA. The temperatures of the filaments and the substrate were 2300° C. and 1300° C. The growth time was 180 minutes.

Figure 9:
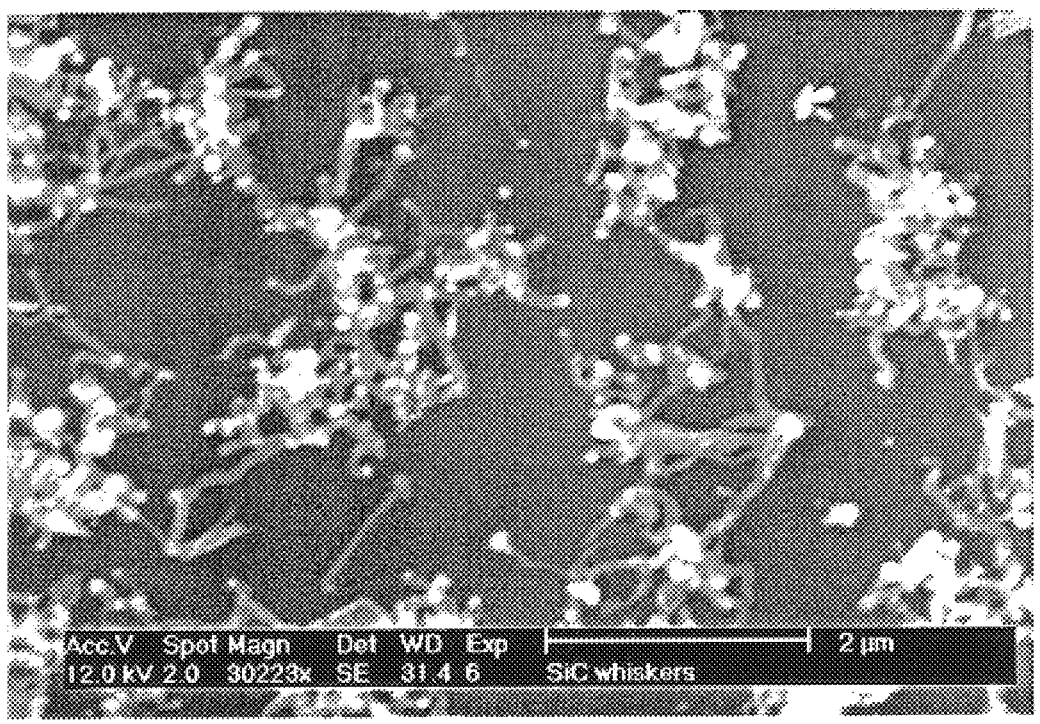
FIG. 9 is an SEM micrograph of the β-SiC nanorods grown on the Si(100) substrate as described as example 3.
Figure 10:
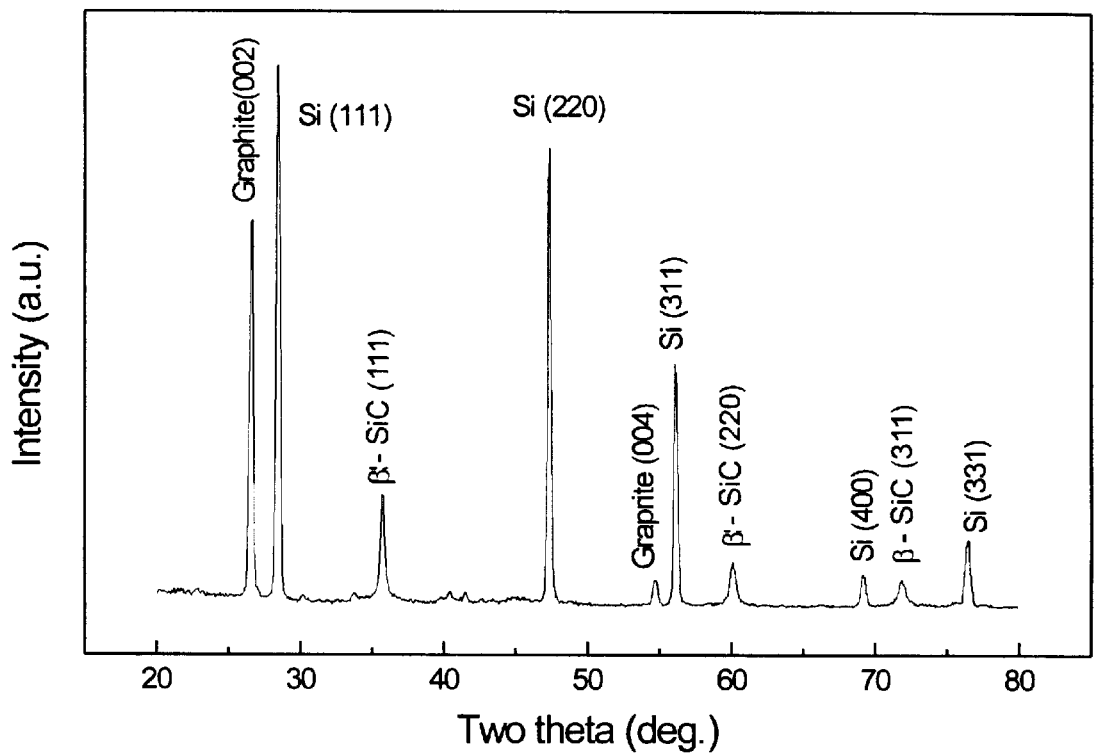
FIG. 10 is an XRD spectrum of the β-SiC nanorods shown in FIG. 9.
Figure 11:
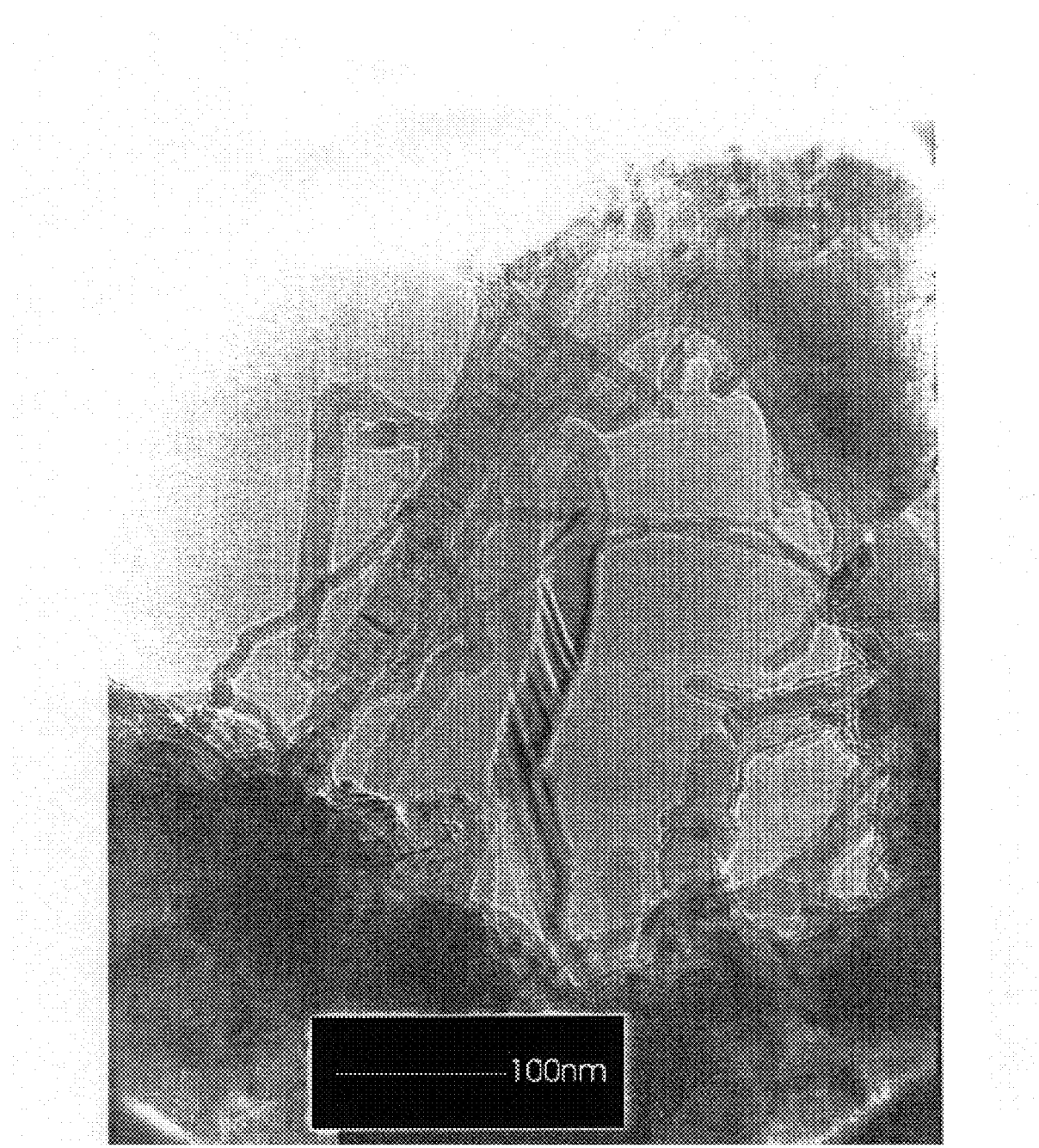
FIG. 11 is a plane view TEM micrograph of the β-SiC nanorods shown in FIG. 9.

An SEM micrograph of the as grown sample is shown in FIG. 9. An XRD spectrum is shown in FIG. 10. It shows the β-SiC(111), (220) and (311) peaks and the Si(111), (220), (311), (400) and (331) peaks. The (002) and (004) peaks of graphite can also be observed. A TEM micrograph of the nanorods is shown in FIG. 11. The diameters of the β-SiC nanorods are in the range of 10–40 nm. EDX microanalysis also showed that chromium particles are present at the tips of most nanorods.

Example 4

β-SiC nanorods in this example were prepared in the apparatus as shown in FIG. 1. The substrate was photoengraved silicon dioxide films on silicon wafer, and the pressed solid plate was composed of silicon, graphite and iron powders in the molar ratio of 1:9:0.0025. The distance between the pressed plate and the filaments was 4 mm and that between the filaments and substrate was 1 mm. The hydrogen flow rate was 100 sccm. The pressure was 70 Torr. The filament temperature was 1800° C. and the substrate temperature was 1100° C. The growth time was 90 minutes. After the reaction, the β-SiC nanorods grown on silicon dioxide were peeled off by etching off the underlying silicon dioxide layer in a HF solution.

Figure 12:
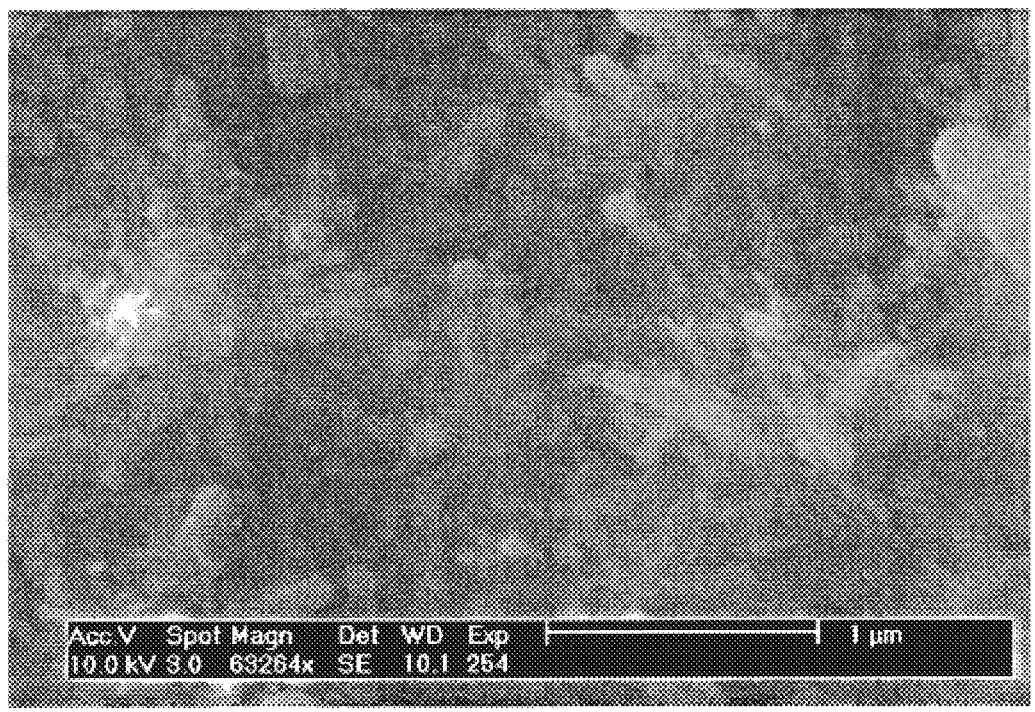
FIG. 12 is an SEM micrograph of the β-SiC nanorods grown on the photoengraved silicon dioxide film as described as example 4.
Figure 13:
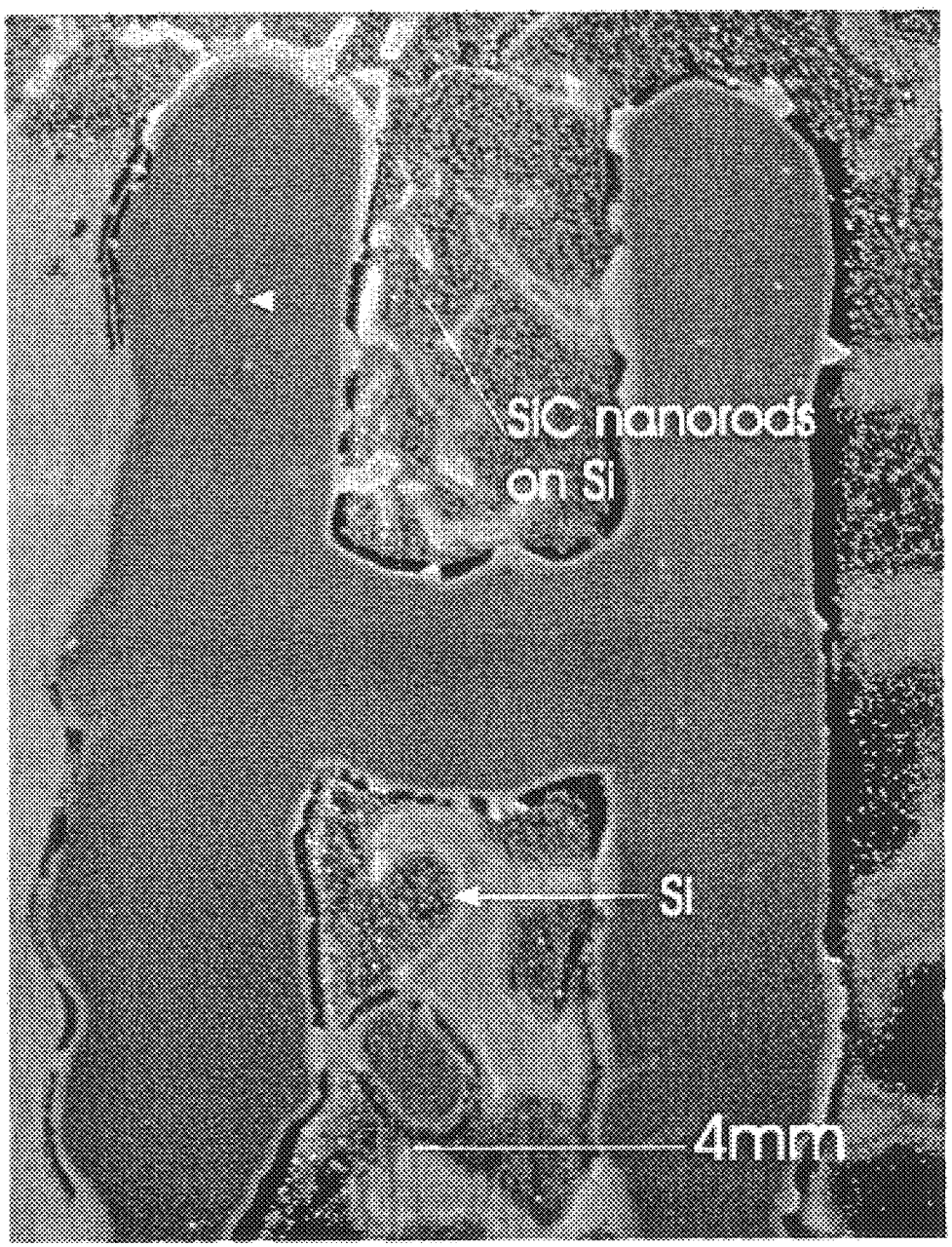
FIG. 13 is the patterned β-SiC nanorods deposited on silicon.
Figure 14:
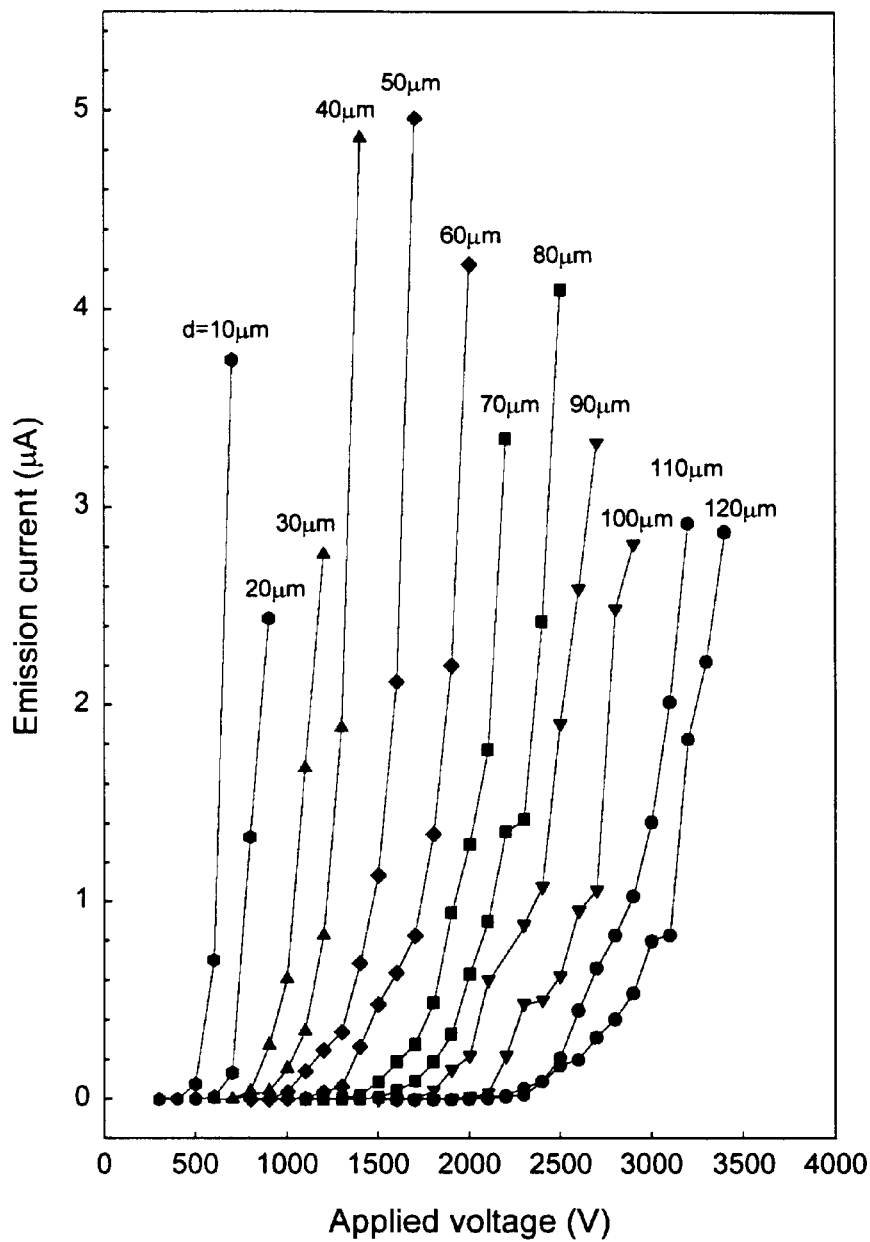
FIG. 14 is I–V characteristics of β-SiC nanorods at different anode-sample separation.
Figure 15:
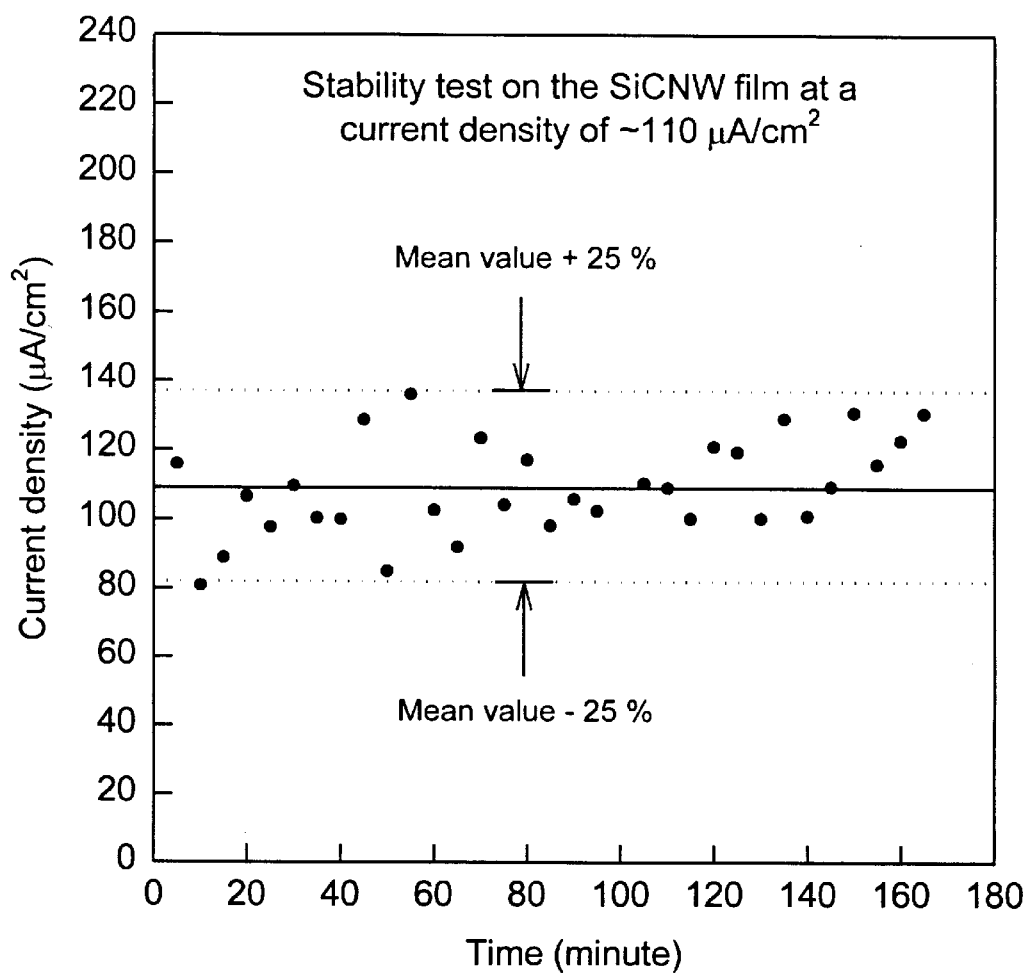
FIG. 15 is field emission stability of the β-SiC nanorods at a constant applied voltage.
Figure 16:
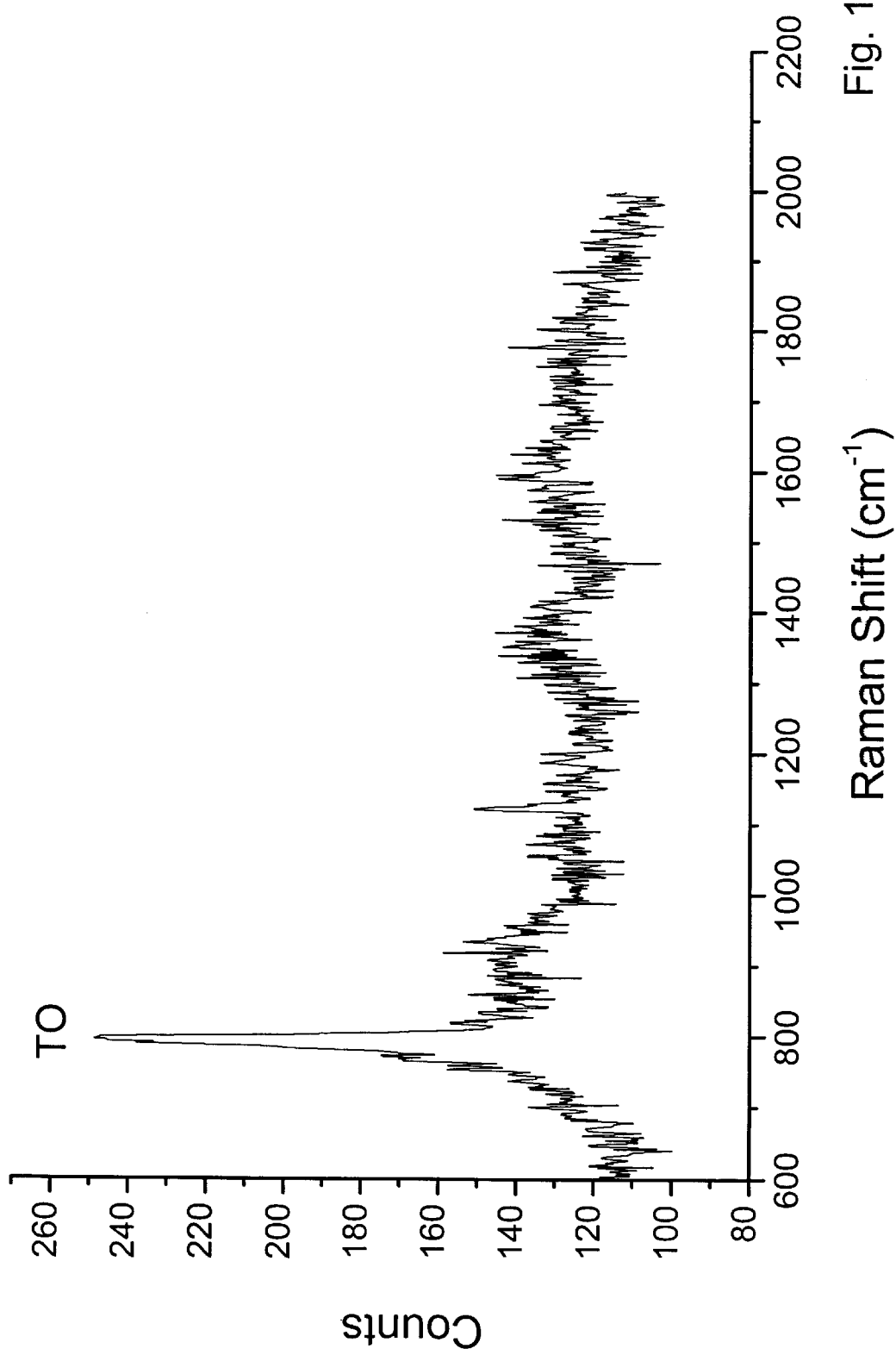
FIG. 16 is a Raman spectrum of the β-SiC nanorods shown in FIG. 12.
Figure 17:
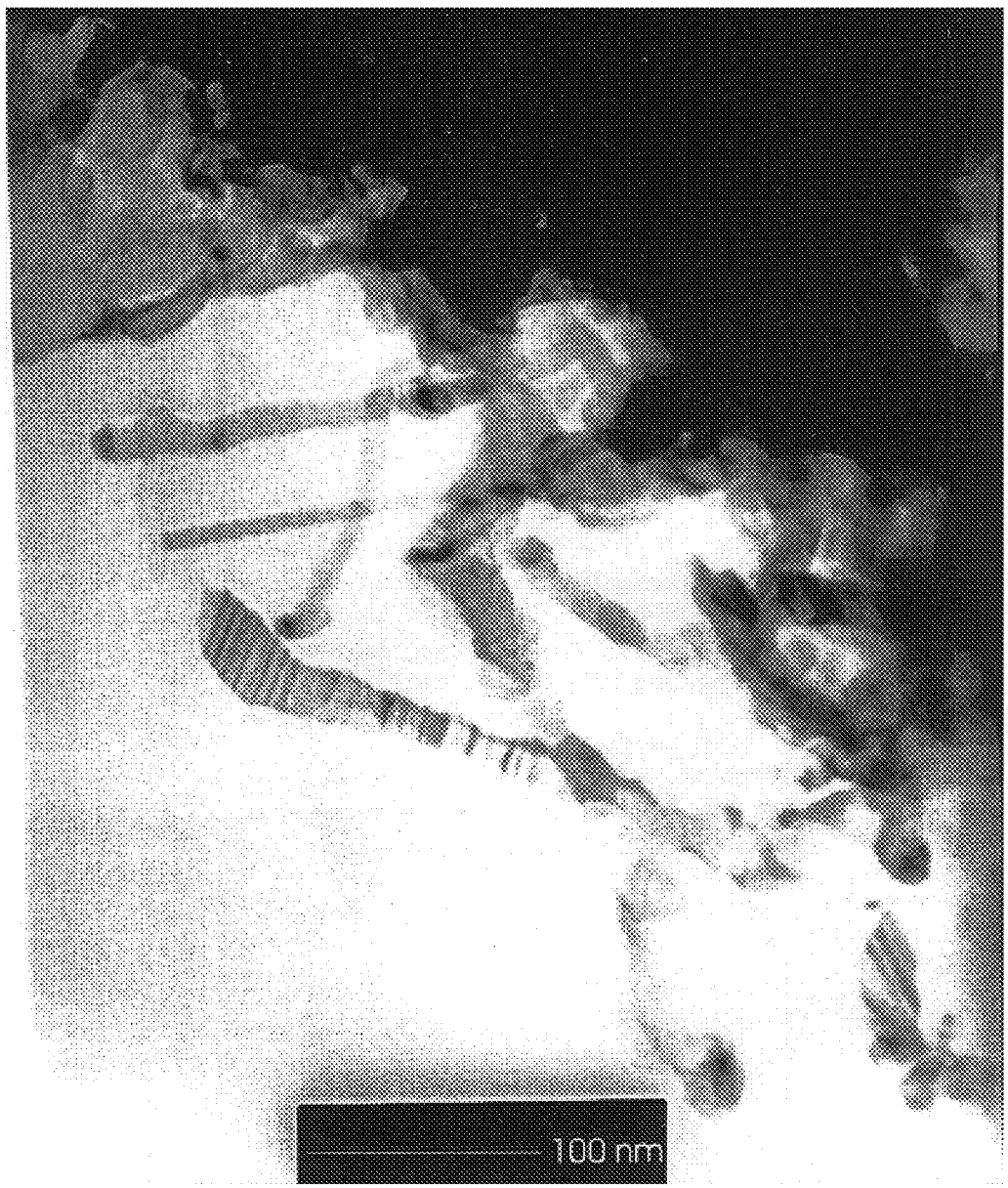
FIG. 17 is a plane view transmission electron microscopy (TEM) micrograph of the β-SiC nanorods shown in FIG. 12.
Figure 18:
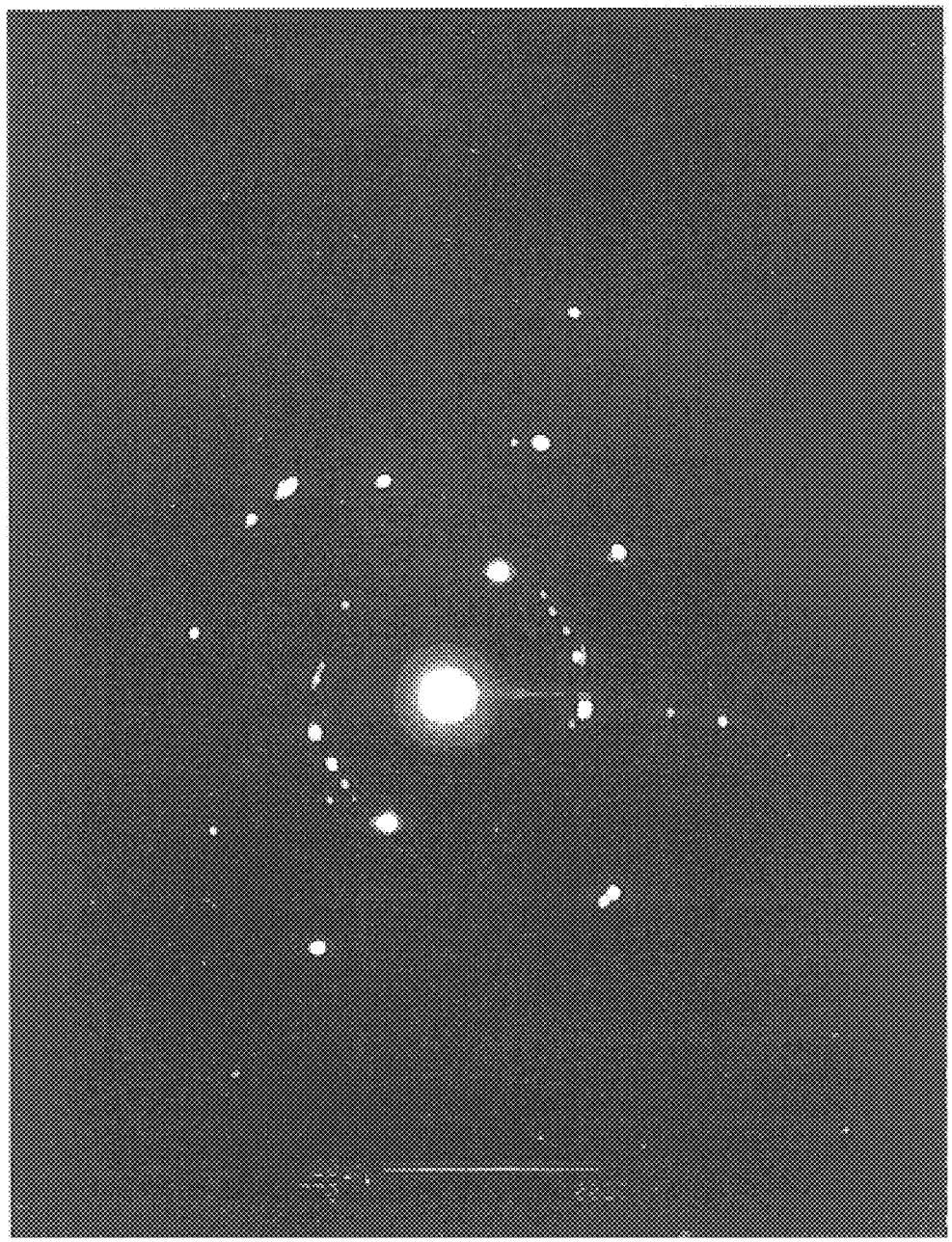
FIG. 18 is a selected area diffraction (SAD) pattern of β-SiC nanorods shown in FIG. 17.

An SEM micrograph of the as grown sample is shown in FIG. 12. The patterned β-SiC nanorods deposited on silicon is shown in FIG. 13. FIG. 14 shows I–V characteristics at different anode-sample separation, and FIG. 15 shows field emission stability at a constant applied voltage of the β-SiC nanorods. The Raman spectrum (FIG. 16) of the sample shows the presence of β-SiC and silicon. The peak at 796 $cm^{-1}$ correspond to the TO phonon peak of β-SiC and the peak at 964 $cm^{-1}$ correspond to the second order of silicon. A TEM micrograph of the sample is shown in FIG. 17, which shows that the diameters of nanorods are of 10–40 nm. A corresponding SAD pattern is shown in FIG. 18. The SAD pattern shows that the nanorods are β-SiC. Again iron was found via EDX microanalysis at the tips of most nanorods.

Example 5

β-SiC nanorods in this example were prepared in the apparatus as shown in FIG. 1. The substrate was a mirror-polished silicon wafer of (111) orientation, and the pressed solid plate was composed of silicon, graphite and iron powders in the molar ratio of 1:9:0.005. The distance between the pressed plate and the filaments was 4 mm and that between the filaments and substrate was 7 mm. The hydrogen flow rate was 100 sccm. The pressure was 100 Torr. The filaments temperature was 1900° C. and the substrate temperature was 600° C. The growth time was 30 minutes.

Figure 19:
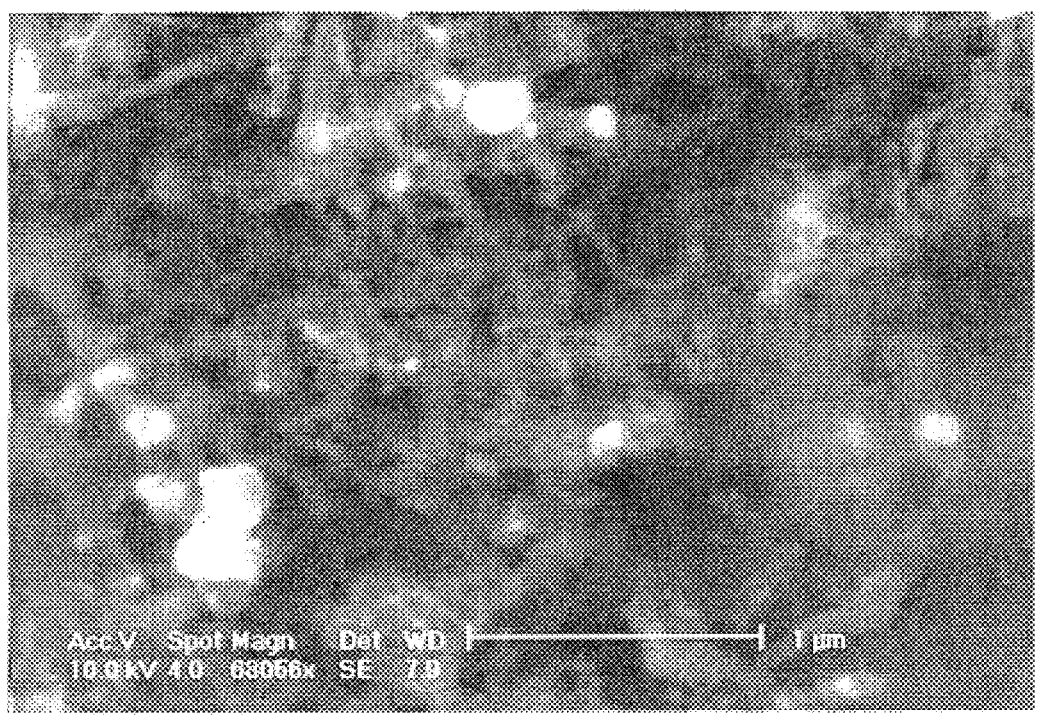
FIG. 19 is an SEM micrograph of the β-SiC nanorods grown on the photoengraved silicon dioxide film, as described as example 5.
Figure 20:
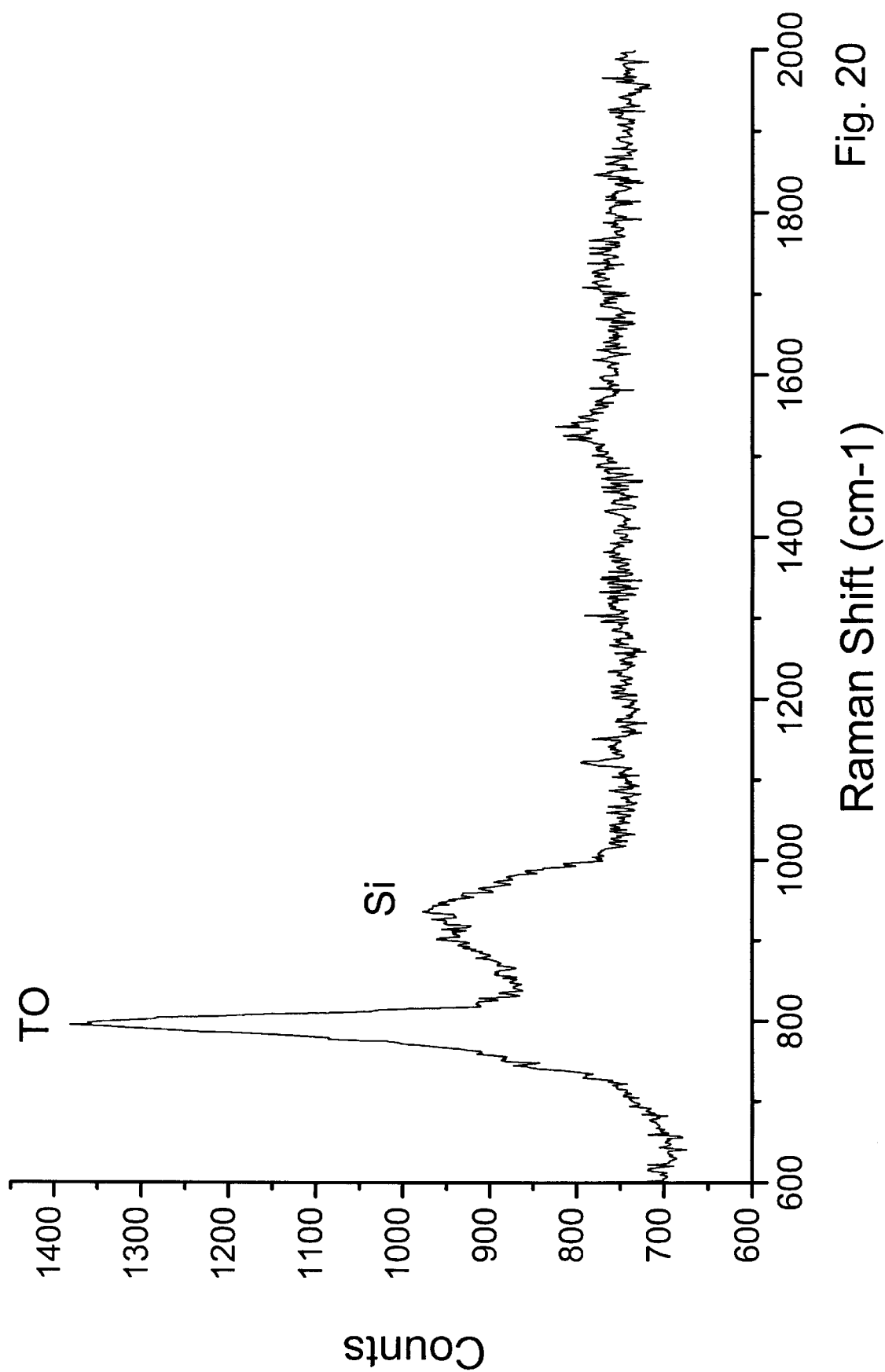
FIG. 20 is a Raman spectrum of the β-SiC nanorods shown in FIG. 19.
Figure 21:
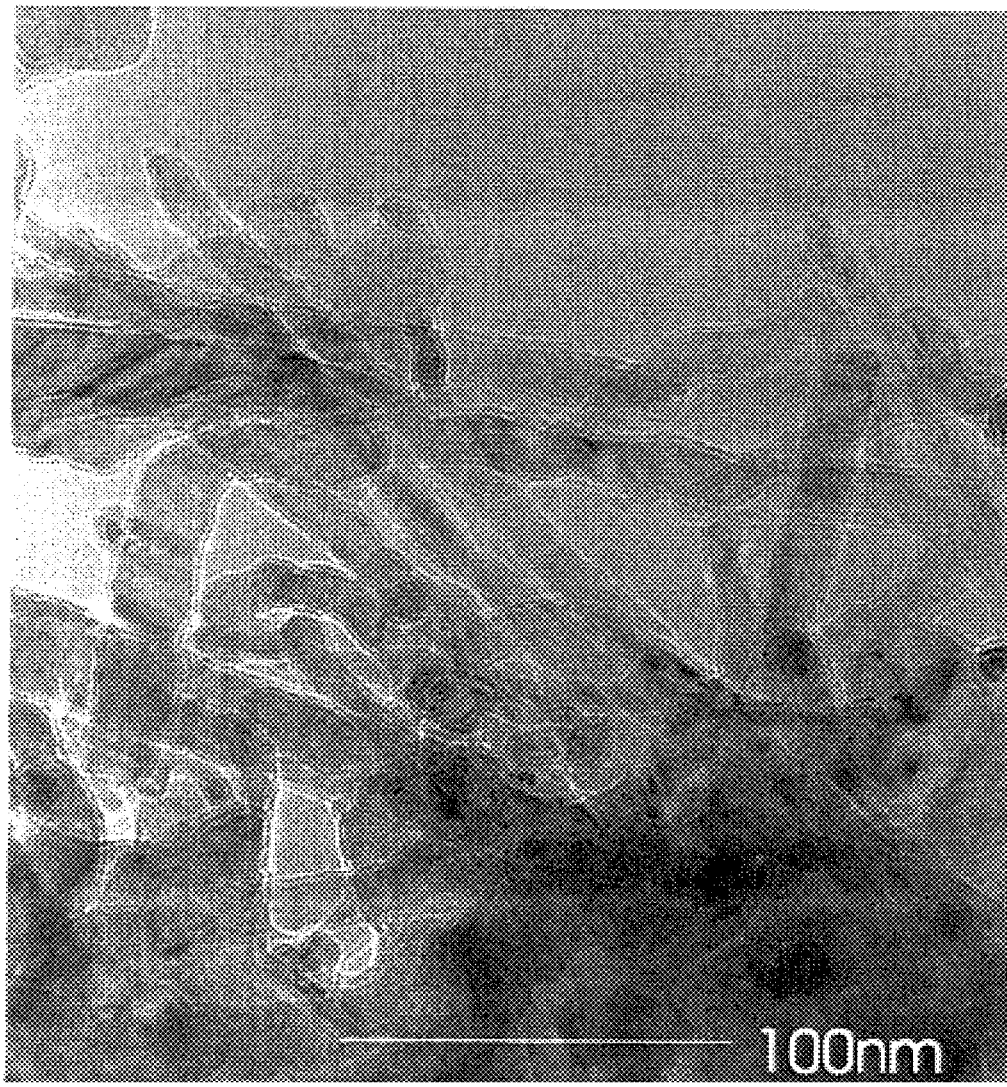
FIG. 21 is a plane view TEM micrograph of the β-SiC nanorods shown in FIG. 19.

An SEM micrograph of the as grown sample is shown in FIG. 19. A typical Raman spectrum of the sample (FIG. 20) shows the presence of β-SiC and silicon. The peak at 796 $cm^{-1}$ corresponds to the TO phonon peak of β-SiC and the peak at 964 $cm^{-1}$ corresponds to the second order of silicon. A TEM micrograph of sample (FIG. 21) shows that the diameters of nanorods are of 10–40 nm. Again iron was found via EDX microanalysis at the tips of most nanorods.

What is claimed is:

1. A method for the growth of beta-silicon carbide nanorods on a substrate by chemical vapor deposition, wherein solid carbon and solid silicon are used as the carbon and silicon sources, hydrogen is used as a reactant gas, and wherein a metal powder is used as a catalyst.

2. A method as claimed in claim 1 wherein a plate or target formed from silicon powder, graphite and said metal powder is used as the sources of silicon and carbon.

3. A method as claimed in claim 1 wherein said catalyst is selected from any of iron, chromium and nickel or any combination thereof.

4. A method as claimed in claim 1 wherein said substrate is a silicon wafer.

5. A method as claimed in claim 1 wherein said chemical vapor deposition comprises hot filament excitation.

6. A method as claimed in claim 5 wherein the filament temperature is maintained in the range of from about 1800° C. to 2300° C.

7. A method as claimed in claim 1 wherein said substrate is maintained at a temperature in the range of from about 600° C. to 1300° C.

8. A method as claimed in claim 5 wherein the distance between the filament and the source is maintained between 1 to 4 mm.

9. A method as claimed in claim 5 wherein the distance between the filament and the substrate is maintained between 1 to 7 mm.

10. A method as claimed in claim 1 wherein the deposition time is between 3 to 180 minutes.

11. A method as claimed in claim 1 wherein the reactant gas is at a pressure of between 10 to 100 Torr.

12. A method as claimed in claim 1 wherein the substrate is electrically biased.

13. A method as claimed in claim 12 wherein the substrate is biased by at least 200 V.

14. A method as claimed in claim 1 wherein the nanorods are deposited in a pattern on the substrate.

15. A method as claimed in claim 14 wherein said substrate is a silicon wafer coated with a silicon dioxide layer and said substrate is photoengraved with a desired pattern prior to deposition of said nanorods, and wherein after deposition of said nanorods said silicon dioxide layer is removed by chemical etching.

* * * * *